Aug. 26, 1969 R. W. SOSHEA ET AL 3,463,971

HYBRID SEMICONDUCTOR DEVICE INCLUDING DIFFUSED-JUNCTION
AND SCHOTTKY-BARRIER DIODES
Filed April 17, 1967

INVENTORS
RICHARD W. SOSHEA
ROBERT A. ZETTLER

United States Patent Office 3,463,971

Patented Aug. 26, 1969

3,463,971

HYBRID SEMICONDUCTOR DEVICE INCLUDING DIFFUSED-JUNCTION AND SCHOTTKY-BARRIER DIODES

Richard W. Soshea, Sunnyvale, and Robert A. Zettler, Los Altos, Calif., assignors to Hewlett-Packard Company, Palo Alto, Calif., a corporation of California Filed Apr. 17, 1967, Ser. No. 631,538
Int. Cl. H01l 3/00, 5/00
U.S. Cl. 317—234 4 Claims

ABSTRACT OF THE DISCLOSURE

A semiconductor device includes a Schottky-barrier diode surrounded by a p-n junction diode.

The present invention combines the high speed characteristics of a Schottky-barrier diode with the reliable features and freedom from undesirable surface effects of a passivated p-n junction diode. In accordance with the illustrated embodiments of the present invention, the p-n junction diode surrounds the Schottky-barrier diode region and an oxide layer masks the surface edge of the p-n junction.

Figure 1:
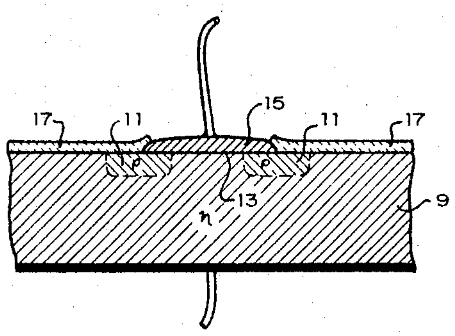
Figure 2:
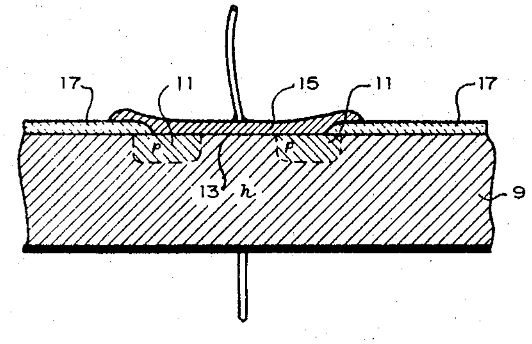

Referring to the drawing, FIGURE 1 is a sectional view of a semiconductor device according to one embodiment which includes a passivating oxide layer for the p-n junction diode that overlaps the Schottky-barrier diode metallic electrode and FIGURE 2 is a sectional view of a semiconductor diode device according to another embodiment which includes a passivating oxide layer for the p-n junction diode with a metallic Schottky-barrier diode electrode overlapping the oxide layer.

In each of these embodiment a semiconductor body 9 of one conductivity type includes a region 11 of opposite conductivity type which surrounds or encloses a surface portion 13 of the body 9 in an enclosing or confining configuration such as in a conventional bull's-eye or star or interdigital pattern. This region 11 of opposite conductivity type in the body 9 provides the p-n junction portion of the present hybrid structure and may be formed using conventional processes, such as diffusion, alloying, epitaxial deposition, or ion implantation.

In each of the illustrated embodiments, a metallic electrode 15 of, for example, silver, gold or some other metal is provided in surface contact with the body 9 in the enclosed surface portion 13 using conventional metal vapor deposition techniques, or the like. In the embodiment of FIGURE 1, this metallic electrode 15 extends over the enclosed surface area 13 to form the Schottky-barrier diode portion of the present hybrid structure where it contacts a surface portion of the semiconductor body 9. A passivating insulator such as an oxide layer 17 is then formed over the remaining surface edge of the p-n junction between body 9 and region 11 and over the remaining surface portion of the region 11. A generally ring-shaped portion of the passivating layer 17 might also be formed on the surface of the body 9 over the inner edge of the p-n junction formed between the region 11 and the body 9. Metallic electrode 15 could then be insulated from this inner edge of the p-n junction although still contacting both the surface of the region 11 and the surface of the enclosed portion of body 9. The passivating oxide layer 17 may also be formed on the surface of the body 9 before the p-n junction diode is formed. The p-n junction diode might then be formed by diffusing the region 11 into the body 9 through a generally ring-shaped hole formed in the passivating oxide layer 17. In the embodiment of FIGURE 2, a passivating oxide layer 17 may be formed using conventional techniques over the outer surface edge of the p-n junction formed by the body 9 and region 11 and over a portion of the surface of region 11. The metallic electrode 15 may then be formed using conventional techniques such as metal-vapor deposition to contact the enclosed surface portion 13 of the body 9 and the remaining surface portion of the region 11 and to overlay the passivating oxide layer 17. This electrode 15 thus forms the Schottky-barrier diode portion of the present hybrid structure where it contacts the surface portion of the body 9 and also serves as one electrode of the device. Low ohmic contact at the base of body 9 thus provides the other electrical connection for the Schottky-barrier and p-n junction diodes.

Therefore, the hybrid diode device of the present invention is a high speed, majority carrier device with characteristics similar to a Schottky-barrier diode and also has the reliable passivated characteristics of an oxide passivated p-n junction diode.

We claim:

1. A semiconductor device comprising:

a body of semiconductor material of one conductivity type;

a region in said body of the opposite conductivity type forming with said body a p-n junction therein;

a metallic electrode that forms a Schottky-barrier in contact with said semiconductor material disposed in contact with a surface of said body of one conductivity type and in contact with a surface of said region of opposite conductivity type; and means providing electrical connections to said body and said metallic electrode.

2. A semiconductor device as in claim 1 wherein:

said region of opposite conductivity type is disposed in an area-enclosing pattern; and said metallic electrode is disposed in contact with a portion of the surface of the body enclosed within the pattern of said region of opposite conductivity type.

3. A semiconductor device as in claim 2 wherein:

said metallic electrode is disposed over an inner surface edge of the junction formed between the body and the region of opposite conductivity type.

4. A semiconductor device as in claim 2 wherein:

said region of opposite conductivity type forms with said body a p-n junction which is exposed at two edges thereof at the surface of the body;

said metallic electrode is disposed over the edge of the p-n junction contiguous with the surface area of the body enclosed by said region; and a passivating insulating layer is disposed over the remaining edge of the p-n junction exposed at the surface of the body.

References Cited

Soshea: Hot Carrier Diodes, Electronics, July 19, 1963, pp. 53–55.

Goetzberger et al.: Avalanche Effects in Silicon P-N Junctions, Journal of Appl. Physics, 34, 6, 1963, pp. 1591–1593.

JOHN W. HUCKERT, Primary Examiner

M. EDLOW, Assistant Examiner

U.S. Cl. X.R.

317—234